(12) United States Patent
Matsuo et al.

(10) Patent No.: US 11,417,752 B2
(45) Date of Patent: Aug. 16, 2022

(54) METHOD FOR PRODUCING THIN FILM TRANSISTOR

(71) Applicant: NISSIN ELECTRIC CO., LTD., Kyoto (JP)

(72) Inventors: Daisuke Matsuo, Kyoto (JP); Yasunori Ando, Kyoto (JP); Yoshitaka Setoguchi, Kyoto (JP); Shigeaki Kishida, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 180 days.

(21) Appl. No.: 16/619,943

(22) PCT Filed: Jun. 7, 2018

(86) PCT No.: PCT/JP2018/021876
§ 371 (c)(1),
(2) Date: Dec. 6, 2019

(87) PCT Pub. No.: WO2018/225822
PCT Pub. Date: Dec. 13, 2018

(65) Prior Publication Data
US 2021/0151585 A1 May 20, 2021

(30) Foreign Application Priority Data
Jun. 7, 2017 (JP) .............................. JP2017-113014

(51) Int. Cl.
*H01L 29/66* (2006.01)
*C23C 14/08* (2006.01)
*C23C 14/34* (2006.01)

(52) U.S. Cl.
CPC ........ *H01L 29/66742* (2013.01); *C23C 14/08* (2013.01); *C23C 14/34* (2013.01)

(58) Field of Classification Search
CPC ........... H01L 29/6674; H01L 21/02172; H01L 21/02502; H01L 21/1225; H01L 21/02266; C23C 14/08; C23C 14/34
See application file for complete search history.

(56) References Cited

U.S. PATENT DOCUMENTS

| 6,514,883 B2 * | 2/2003 | Moriwaki ......... H01L 21/02197 |
| | | 257/E21.01 |
| 2007/0012557 A1 * | 1/2007 | Hosokawa .......... H01J 37/3408 |
| | | 204/192.1 |

(Continued)

FOREIGN PATENT DOCUMENTS

| JP | 2010226101 | 10/2010 |
| JP | 2011142174 | 7/2011 |

(Continued)

OTHER PUBLICATIONS

"International Search Report (Form PCT/ISA/210) of PCT/JP2018/021876," dated Sep. 4, 2018, with English translation thereof, pp. 1-3.

(Continued)

*Primary Examiner* — Dale E Page
*Assistant Examiner* — Quovaunda Jefferson
(74) *Attorney, Agent, or Firm* — JCIPRNET

(57) ABSTRACT

Provided is a method for producing a thin film transistor that has a gate electrode, a gate insulating layer, an oxide semiconductor layer, a source electrode and a drain electrode on a substrate. This method for producing a thin film transistor includes a step for forming the oxide semiconductor layer on the gate insulating layer by performing sputtering on a target with plasma. The step for forming the oxide semiconductor layer includes: a first film formation step in which only argon is supplied as a sputtering gas to perform sputtering; and a second film formation step in which a mixed gas of argon and oxygen is supplied as the sputtering (Continued)

gas to perform sputtering. A bias voltage applied to the target is a negative voltage of −1 kV or higher.

13 Claims, 12 Drawing Sheets

(56) References Cited

U.S. PATENT DOCUMENTS

| | | | | |
|---|---|---|---|---|
| 2011/0108834 A1* | 5/2011 | Yamazaki | ............... | H01L 29/45 |
| | | | | 257/43 |
| 2012/0168743 A1* | 7/2012 | Lee | .................... | H01L 29/7869 |
| | | | | 257/43 |

FOREIGN PATENT DOCUMENTS

| | | |
|---|---|---|
| JP | 2012119672 | 6/2012 |
| JP | 2013211544 | 10/2013 |
| JP | 2015179839 | 10/2015 |
| JP | 2016056446 | 4/2016 |
| KR | 20080064269 | 7/2008 |
| KR | 20140144744 | 12/2014 |
| KR | 20150092375 | 8/2015 |
| WO | 2012031962 | 3/2012 |

OTHER PUBLICATIONS

"Office Action of Korea Counterpart Application", dated Feb. 26, 2021, with English translation, p. 1-p. 10.

* cited by examiner

METHOD FOR PRODUCING THIN FILM TRANSISTOR

CROSS-REFERENCE TO RELATED APPLICATION

This application is a 371 application of the international PCT application serial no. PCT/JP2018/021876, filed on Jun. 7, 2018, which claims the priority benefits of Japan application no. 2017-113014, filed on Jun. 7, 2017. The entirety of each of the abovementioned patent applications is hereby incorporated by reference herein and made a part of this specification.

BACKGROUND OF THE INVENTION

Technical Field

The present invention relates to a method for producing a thin film transistor having an oxide semiconductor layer. More particularly, the present invention relates to a method for producing a thin film transistor in which an oxide semiconductor layer is formed by performing sputtering on a target with plasma.

Related Art

In recent years, a thin film transistor with an In—Ga—Zn—O (IGZO) oxide semiconductor film used for a channel layer has been developed actively. In a step of producing the thin film transistor having the oxide semiconductor film, when an oxygen deficiency is generated in the oxide semiconductor film, the conductivity thereof is changed, which possibly deteriorates the electrical characteristics of the thin film transistor. Therefore, various attempts have been made in the past in order to prevent the oxygen deficiency in the oxide semiconductor film.

For example, in patent literature 1, a method is disclosed in which a ratio of an oxygen flow rate relative to the total flow rate of sputtering gas is set to 90% or above and 100% or below and sputtering is performed on a metal oxide serving as a target to thereby form an oxide semiconductor layer in an oxygen-excess state, and the oxide semiconductor layer is configured to be coated by a fine metal oxide to thereby obtain a thin film transistor having the oxygen-excess oxide semiconductor layer with good reproducibility.

However, in the method disclosed in patent literature 1, since oxygen with a high concentration is used as the sputtering gas, the density of plasma generated near a surface of the target is reduced. As a result, the sputtering rate decreases and the film formation speed of the oxide semiconductor layer is reduced.

In the sputtering method as disclosed in patent literature 1 in which the oxygen with a high concentration is used as the sputtering gas, it is necessary to increase a bias voltage applied to the target in order to increase the sputtering rate. However, in this case, energy of ions colliding with the target is increased, and oxygen escapes from the metal oxide serving as the target during the collision. Therefore, there is a risk that the material composition of the target is different from that of the film formed on the substrate and the film quality is deteriorated.

LITERATURE OF RELATED ART

Patent Literature

Patent literature 1: Japanese Patent Laid-Open No. 2012-119672

SUMMARY

Problems to be Solved

The present invention has been made in view of the above problems, and the present invention is mainly directed to provide a method for producing a thin film transistor, which can prevent the oxygen deficiency of the oxide semiconductor layer, form an oxide semiconductor layer with excellent film quality and form the oxide semiconductor layer at a high film formation speed, thereby improving the productivity.

Means to Solve Problems

That is, the method of the present invention for producing a thin film transistor having an oxide semiconductor layer is a method for producing a thin film transistor having a gate electrode, a gate insulating layer, an oxide semiconductor layer, a source electrode, and a drain electrode on a substrate, and is characterized in including a step of performing sputtering on a target with plasma to thereby form the oxide semiconductor layer on the gate insulating layer. The step of forming the oxide semiconductor layer includes: a first film formation step in which only argon is supplied as a sputtering gas to perform sputtering; and a second film formation step in which a mixed gas of argon and oxygen is supplied as the sputtering gas to perform sputtering. A bias voltage applied to the target is a negative voltage of −1 kV or higher.

According to this producing method, since the bias voltage applied to the target is lower than before (e.g., −1 kV to −2 kV), the generation of sputtered particles from which oxygen escapes can be inhibited. As a result, a film maintaining the same oxide state as the target is formed on the substrate, and a high-quality film can be formed.

In addition, since the bias voltage applied to the substrate is low, the sputtered particles from which oxygen has not escaped reach the substrate. As a result, it is possible that only argon is supplied as the sputtering gas to perform sputtering, and thus the film formation speed can be increased compared to the case where oxygen is supplied in addition to argon.

Further, the oxide semiconductor layer having a large amount of oxygen in the film can be formed by the second film formation step in which a mixed gas of argon and oxygen is supplied as the sputtering gas. As a result, the oxygen deficiency of the oxide semiconductor layer can be prevented, and a thin film transistor having excellent electrical characteristics can be produced.

In addition, in the specification, "only argon is supplied as the sputtering gas" means that the concentration of argon in the supplied sputtering gas is 9.9999% or more.

Preferably, in the second film formation step, the concentration of oxygen in the mixed gas is 5% or below.

According to this configuration, the oxygen concentration in the sputtering gas in the second film formation step decreases, the density of the plasma generated near the surface of the target can be further increased, and the film formation speed can be further increased.

Preferably, a film thickness of a first semiconductor layer formed by the first film formation step is greater than a film thickness of a second semiconductor layer formed by the second film formation step.

According to this configuration, in the step of forming the oxide semiconductor layer, the proportion of implementation of the first film formation step in which the film formation speed is high can be increased, the average film formation speed of the oxide semiconductor layer as a whole can be increased, and the productivity can be further improved.

Preferably, the bias voltage applied to the target during sputtering is a negative voltage of −600 V or higher.

According to this configuration, since the bias voltage applied to the target is lower, the energy of ions colliding with the target becomes smaller. As a result, during the collision of the ions, the amount of oxygen escaping from the metal oxide serving as the target can be further reduced, and the oxide semiconductor layer having more excellent film quality can be formed.

In the step of forming the oxide semiconductor layer, the second film formation step may be performed after the first film formation step.

According to this configuration, a second semiconductor layer having a large amount of oxygen in the film may be arranged on the first semiconductor layer. Therefore, in a heat treatment step or the like as a subsequent step, the oxygen can be inhibited from escaping from the first semiconductor layer. As a result, the oxygen deficiency of the first semiconductor layer can be inhibited, and the thin film transistor having more excellent electrical characteristics can be produced.

In addition, in the step of forming the oxide semiconductor layer, the second film formation step may be performed first, followed by the first film formation step, followed by the second film formation step.

According to this configuration, the first semiconductor layer may be disposed between the second semiconductor layers having a large amount of oxygen in the film. Therefore, in a heat treatment step or the like as a subsequent step, the oxygen can be inhibited from escaping from the first semiconductor layer. Further, the second semiconductor layer can supply oxygen to the first semiconductor layer from both an upper surface side and a lower surface side of the first semiconductor layer. As a result, the oxygen deficiency of the first semiconductor layer can be inhibited, and the thin film transistor having more excellent electrical characteristics can be produced.

Preferably, the sputtering in the first film formation step and the second film formation step is carried out at a pressure of 0.5 Pa or higher and 3.1 Pa or lower.

According to this configuration, the film formation speed can be further increased. Since the average free step is lengthened by further reducing the pressure during sputtering, the sputtered particles are attached to the substrate without diffusion during transport, and the film formation speed can be further improved. Therefore, the sputtering is preferably performed at a pressure of 3.1 Pa or lower. On the other hand, when the pressure is less than 0.5 Pa, it possibly fails to generate and maintain the plasma. Accordingly, the range above becomes appropriate.

Preferably, the first film formation step and the second film formation step sputter using a sputtering apparatus including: a vacuum container which is evacuated and into which a gas is introduced; a substrate holding part which holds a substrate in the vacuum container; a target holding part which holds a target so as to face the substrate in the vacuum container; and a plurality of antennas which is arranged along a surface of the substrate held by the substrate holding part and generates plasma.

By using the above sputtering apparatus, the setting of a high frequency voltage supplied to the antennas and the bias voltage to the target can be independently performed, and thus it is possible to set the bias voltage to a low voltage independently from generation of the plasma to the extent that ions in the plasma are attracted to the target such that sputtering is performed. Therefore, the negative bias voltage applied to the target during sputtering can be set to a small value of −1 kV or higher.

Effect

According to the above method of the present invention for producing the thin film transistor, the oxygen deficiency of the oxide semiconductor layer can be prevented, the oxide semiconductor layer with excellent film quality can be formed, and the oxide semiconductor layer can be formed at a high film formation speed to improve the productivity.

Figure 1:
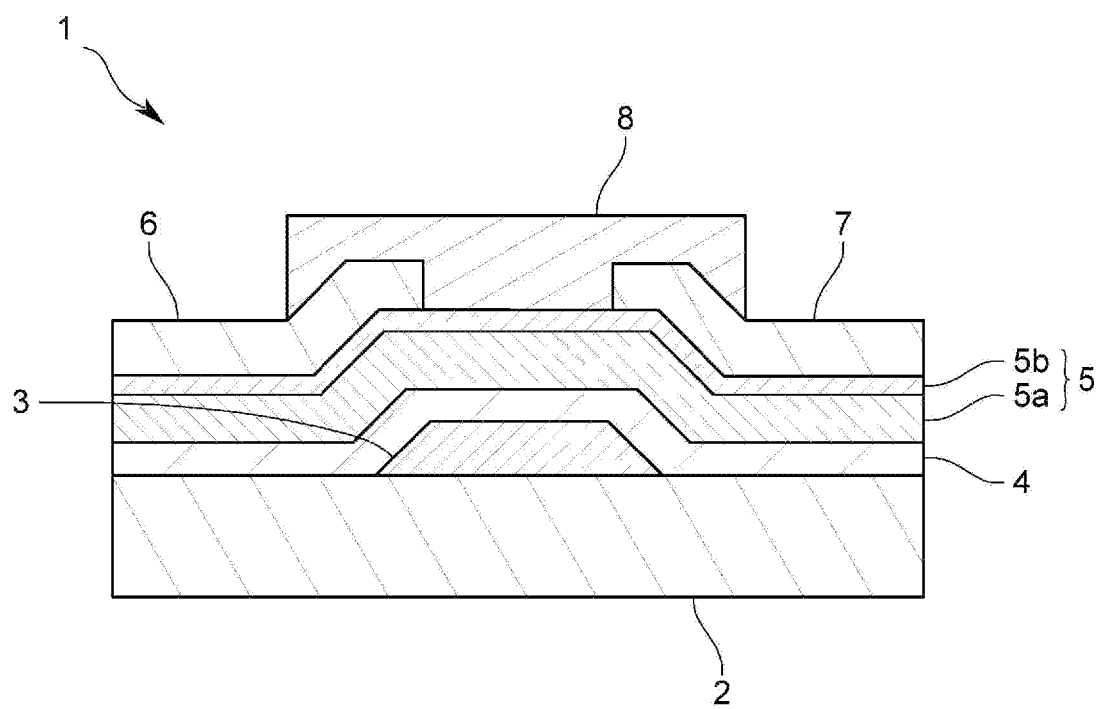
FIG. 1 is a longitudinal sectional view illustrating a configuration of a thin film transistor of the present embodiment.

REFERENCE SIGNS LIST 1 thin film transistor
2 substrate 3 gate electrode
4 gate insulating layer
5 oxide semiconductor layer
5a first semiconductor layer
5b second semiconductor layer
6 source electrode
7 drain electrode
8 protective film
100 sputtering apparatus
W substrate
P plasma
T target
20 vacuum container
30 substrate holding part
40 target holding part
50 antenna
51 conductor element
52 insulating element
53 capacitor element

DESCRIPTION OF THE EMBODIMENTS

Hereinafter, a thin film transistor according to one embodiment of the present invention and a producing method thereof are described.

<Thin Film Transistor>

First, a configuration of a thin film transistor 1 obtained by the producing method of the embodiment of the present invention is described.

The thin film transistor 1 of the present embodiment is a thin film transistor of a so-called bottom gate structure and has, as shown in FIG. 1, a substrate 2, and a gate electrode 3, a gate insulating layer 4, an oxide semiconductor layer 5, a source electrode 6, a drain electrode 7 and a protective film 8 which are arranged sequentially from a side of the substrate 2.

The substrate 2 is made of a light-permeable material and may be made of, for example, plastics (synthetic resin) such as polyethylene terephthalate (PET), polyethylene naphthalate (PEN), polyether sulfone (PES), acrylic and polyimide, glass, or the like.

The gate electrode 3 is arranged on the substrate 2. The gate electrode 3 is made of a material having a high conductivity and is formed using conductive films of metals such as Si, Al, Mo, Cr, Ta, Ti, Pt, Au and Ag, Al—Nd, Ag alloy, and metal oxides such as tin oxide, zinc oxide, indium oxide, indium tin oxide (ITO), indium zinc oxide (IZO) and In—Ga—Zn—O (IGZO). The gate electrode 3 may be obtained by making these conductive films into a single layer structure or a stacked structure of two or more layers.

The gate insulating layer 4 is arranged on the gate electrode 3. The gate insulating layer 4 is made of a material having a high insulating property and may be, for example, an insulating film of $SiO_2$, $SiN_x$, SiON, $Al_2O_3$, $Y_2O_3$, $Ta_2O_5$, $Hf_2$ and the like, or an insulating film containing at least two or more of these compounds. The gate insulating layer 4 may be obtained by making these insulating films into a single layer structure or a stacked structure of two or more layers.

The oxide semiconductor layer 5 is arranged on the gate insulating layer 4. The oxide semiconductor layer 5 consists of an oxide semiconductor layer containing In and O; for example, the oxide semiconductor layer 5 preferably consists of In—Ga—Zn—O, In—Al—Mg—O, In—Al—Zn—O, In—Hf—Zn—O, etc.

The oxide semiconductor layer 5 of the present embodiment includes a first semiconductor layer 5a formed by sputtering with only argon supplied as the sputtering gas, and a second semiconductor layer 5b formed by sputtering with a mixed gas of argon and oxygen supplied as the sputtering gas. A structure in which the first semiconductor layer 5a and the second semiconductor layer 5b are sequentially stacked from the side of the substrate 2 is formed. The first semiconductor layer 5a is an amorphous oxide semiconductor (a-IGZO) of InGaZnO, and the second semiconductor layer 5b is a crystalline oxide semiconductor (nc-IGZO) of InGaZnO.

In this embodiment, the film thickness of the first semiconductor layer 5a is 50% or more of the film thickness of the oxide semiconductor layer 5 as a whole. That is, the film thickness of the first semiconductor layer 5a is greater than that of the second semiconductor layer 5b.

The source electrode 6 and the drain electrode 7 are arranged on the oxide semiconductor layer 5. The source electrode 6 and the drain electrode 7 are respectively made of a material having a high conductivity to function as electrodes, and may also be made of the same material as the gate electrode 3.

The protective film 8 is arranged on the oxide semiconductor layer 5, the source electrode 6 and the drain electrode 7. The protective film 8 may be formed by a silicon oxide film ($SiO_2$) or a fluorinated silicon nitride film containing fluorine in a silicon nitride film (SiN:F).

<Method for Producing Thin Film Transistor>

Figure 2:
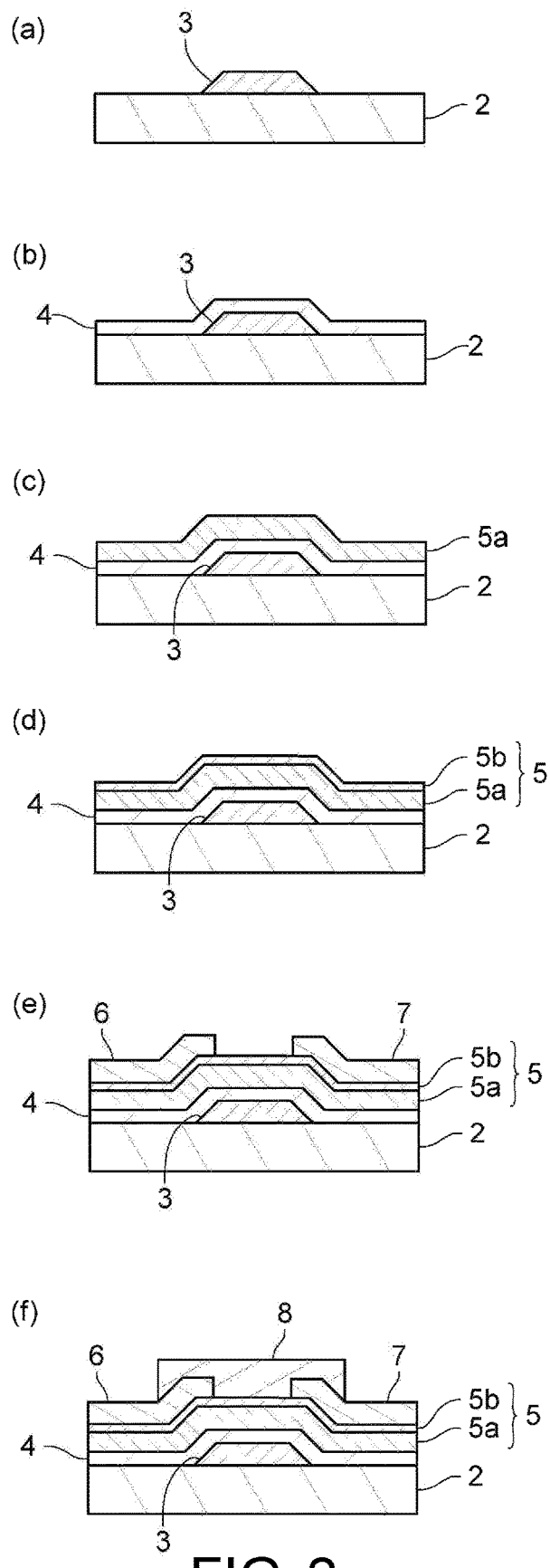
FIG. 2 is a cross-sectional view illustrating a producing step of the thin film transistor of the present embodiment.

Next, the method for producing the thin film transistor 1 of FIG. 1 is explained using FIG. 2.

(Forming of Gate Electrode 3)

First, as shown in (a) of FIG. 2, the substrate 2 composed of, for example, a glass substrate is prepared, and the gate electrode 3 is formed on the surface of the substrate 2. The forming of the gate electrode 3 may be performed, for example, by a conventional sputtering method such as DC sputtering.

(Forming of Gate Insulating Layer 4)

Next, as shown in (b) of FIG. 2, the gate insulating layer 4 is formed to cover the surface of the substrate 2 and the gate electrode 3. The gate insulating layer 4 can be formed by a vapor deposition method such as plasma CVD or the like.

(Forming of Oxide Semiconductor Layer 5)

Figure 3:
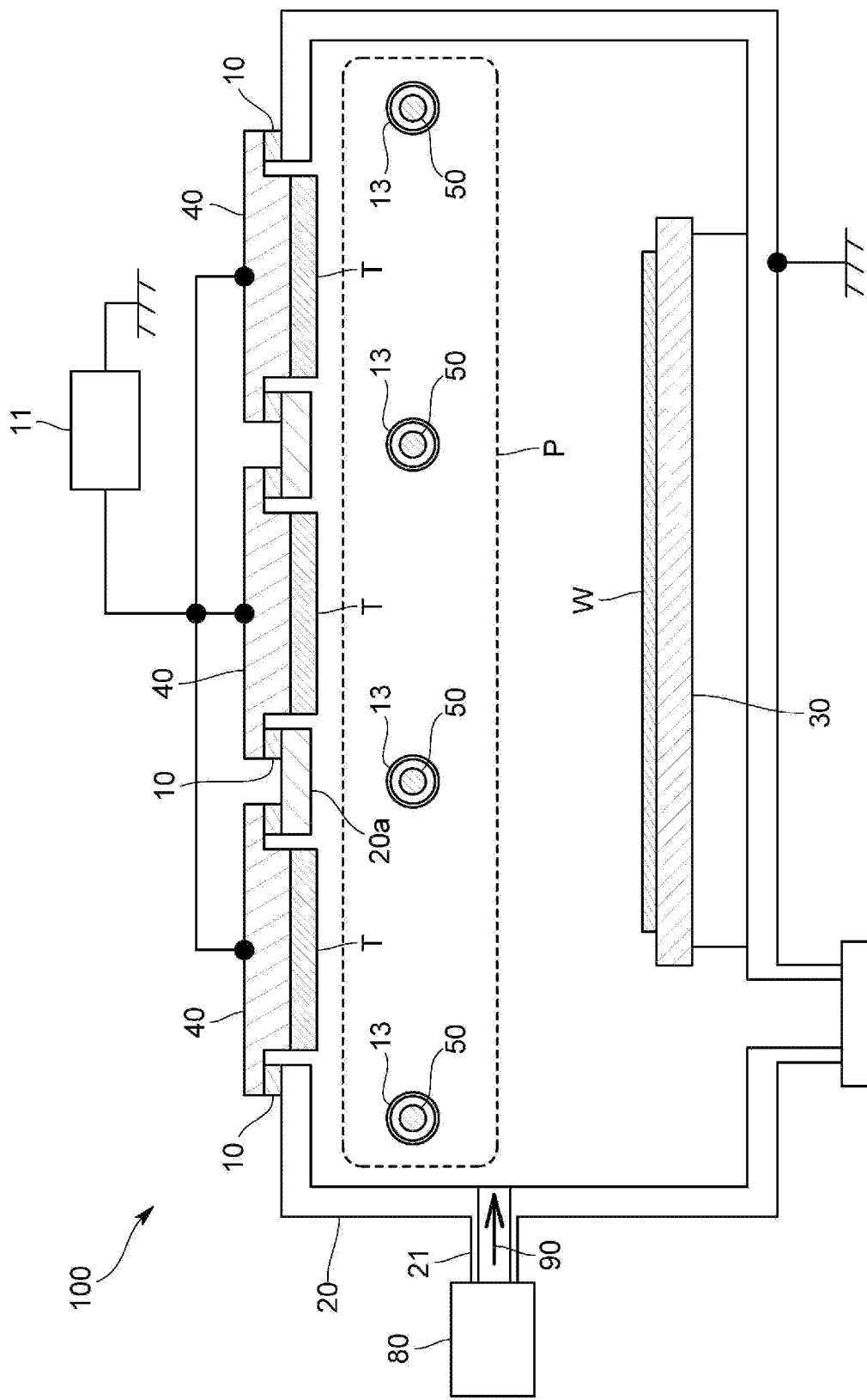
FIG. 3 is a longitudinal sectional view which is orthogonal to a longitudinal direction of an antenna and illustrates a configuration of a sputtering apparatus of the present embodiment.

Next, as shown in (c) and (d) of FIG. 2, the oxide semiconductor layer 5 serving as a channel layer is formed on the gate insulating layer 4. The oxide semiconductor layer 5 of the present embodiment can be formed using a sputtering apparatus 100 as shown in FIG. 3. The sputtering apparatus 100 includes a vacuum container 20 which is evacuated and into which a gas is introduced; a substrate holding part 30 which holds a substrate in the vacuum container 20; a target holding part 40 which holds a target so as to face the substrate in the vacuum container 20; and a plurality of antennas 50 which is arranged along a surface of the substrate held by the substrate holding part 30 and generate plasma.

A step of forming the oxide semiconductor layer 5 of the present embodiment is characterized in including a first film formation step in which only argon is supplied as the sputtering gas to perform sputtering and a second film formation step in which a mixed gas of argon and oxygen is supplied as the sputtering gas to perform sputtering. In both the first film formation step and the second film formation step, conductive oxide sintered bodies of InGaZnO and the like being the raw material of the oxide semiconductor 5 are used as a target, the prepared target is disposed on the target holding part 40, and the substrate 2 is disposed on the substrate holding part 30.

(First Film Formation Step)

First, the first semiconductor layer 5a is formed on the gate insulating layer 4.

Specifically, after the vacuum container 20 is evacuated to $3 \times 10^{-6}$ Torr, the pressure in the vacuum container 20 is adjusted to 0.5-3.1 Pa while argon of 50-200 sccm is introduced as the sputtering gas. Then, high frequency power of 1 kW to 10 kW is supplied to the plurality of antennas 50 to generate and maintain inductively coupled plasma. Direct-current voltage pulses are applied to the target for the sputtering of the target. The voltage applied to the target is a negative voltage of −1 kV or higher, preferably −600 V or higher.

Accordingly, as shown in (c) of FIG. 2, the first semiconductor layer 5a is formed on the gate insulating layer 4.

(Second Film Formation Step)

After forming the first semiconductor layer 5a, as shown in (d) of FIG. 2, the second semiconductor layer 5b is formed on the first semiconductor layer 5a.

Specifically, after the film formation of the first semiconductor layer is completed, the pressure in the vacuum container 20 is adjusted to 0.5-3.1 Pa while a mixed gas of argon and oxygen of 50-200 sccm is introduced as the sputtering gas. Then, high frequency power of 1 kW to 10 kW is supplied to the plurality of antennas 50 to generate and maintain inductively coupled plasma. Direct-current voltage pulses are applied to the target for the sputtering of the target. The voltage applied to the target is a negative voltage of −1 kV or higher, preferably −600 V or higher.

In the second film formation step, it is preferable that the concentration of oxygen in the mixed gas is 5% or less. When the concentration of oxygen is in this range, the film formation speed can be further increased.

In the producing method of this embodiment, it is preferable to perform the first film formation step and the second film formation step so that the film thickness of the first semiconductor layer 5a formed by the first film formation step is greater than that of the second semiconductor layer 5b formed by the second film formation step. For example, the film thickness of the first semiconductor layer 5a can be made greater than that of the second semiconductor layer 5b by changing film formation time, high frequency power of the antennas, and direct current voltage of the target.

(Forming of Source Electrode and Drain Electrode)

Next, as shown in (e) of FIG. 2, a source electrode 6 and a drain electrode 7 are formed on the oxide semiconductor layer 5. The forming of the source electrode 6 and the drain electrode 7 may be performed by, for example, DC sputtering. Specifically, first, the oxide semiconductor layer 5 is coated with a resist, and after exposure and development, the source electrode 6 and the drain electrode 7 which are composed of metal layers are formed by DC sputtering on the oxide semiconductor layer 5 on which the resist is not formed. Then, as shown in (e) of FIG. 2, the source electrode 6 and the drain electrode 7 are formed by stripping off the resist on the oxide semiconductor layer 5.

(Forming of Protective Film)

Next, when necessary, as shown in (f) of FIG. 2, a protective film is formed using, for example, a plasma CVD method to cover upper surfaces of the oxide semiconductor layer 5, the source electrode 6 and the drain electrode 7 that are formed.

(Heat Treatment)

Finally, a heat treatment is carried out in an oxygen-containing environment at atmospheric pressure. A furnace temperature in the heat treatment is preferably 150° C. to 300° C. In addition, the time for heat treatment is preferably 1 hour to 3 hours.

As described above, the thin film transistor 1 of the present embodiment can be obtained.

<Sputtering Apparatus>

Next, the sputtering apparatus 100 used in the "the forming of the oxide semiconductor layer 5" in the above-described producing method is described.

In the above-described step of "forming of the oxide semiconductor layer 5", the setting of the high frequency voltage supplied to the antennas and the bias voltage to the target can be independently performed by using the sputtering apparatus 100. Therefore, it is possible to set the bias voltage to a low voltage independently from generation of the plasma to the extent that ions in the plasma are attracted to the target such that sputtering is performed. Therefore, the negative bias voltage applied to the target during sputtering can be set to a small value of −1 kV or higher.

Hereinafter, a configuration of the sputtering apparatus 100 is described.

The sputtering apparatus 100 of this embodiment is an apparatus for forming a film on a substrate W by using inductively coupled plasma P to perform sputtering on a target T. Here, the substrate W is, for example, a substrate for a flat panel display (FPD) such as a liquid crystal display or an organic EL display or the like, a flexible substrate for a flexible display, or the like.

Figure 4:
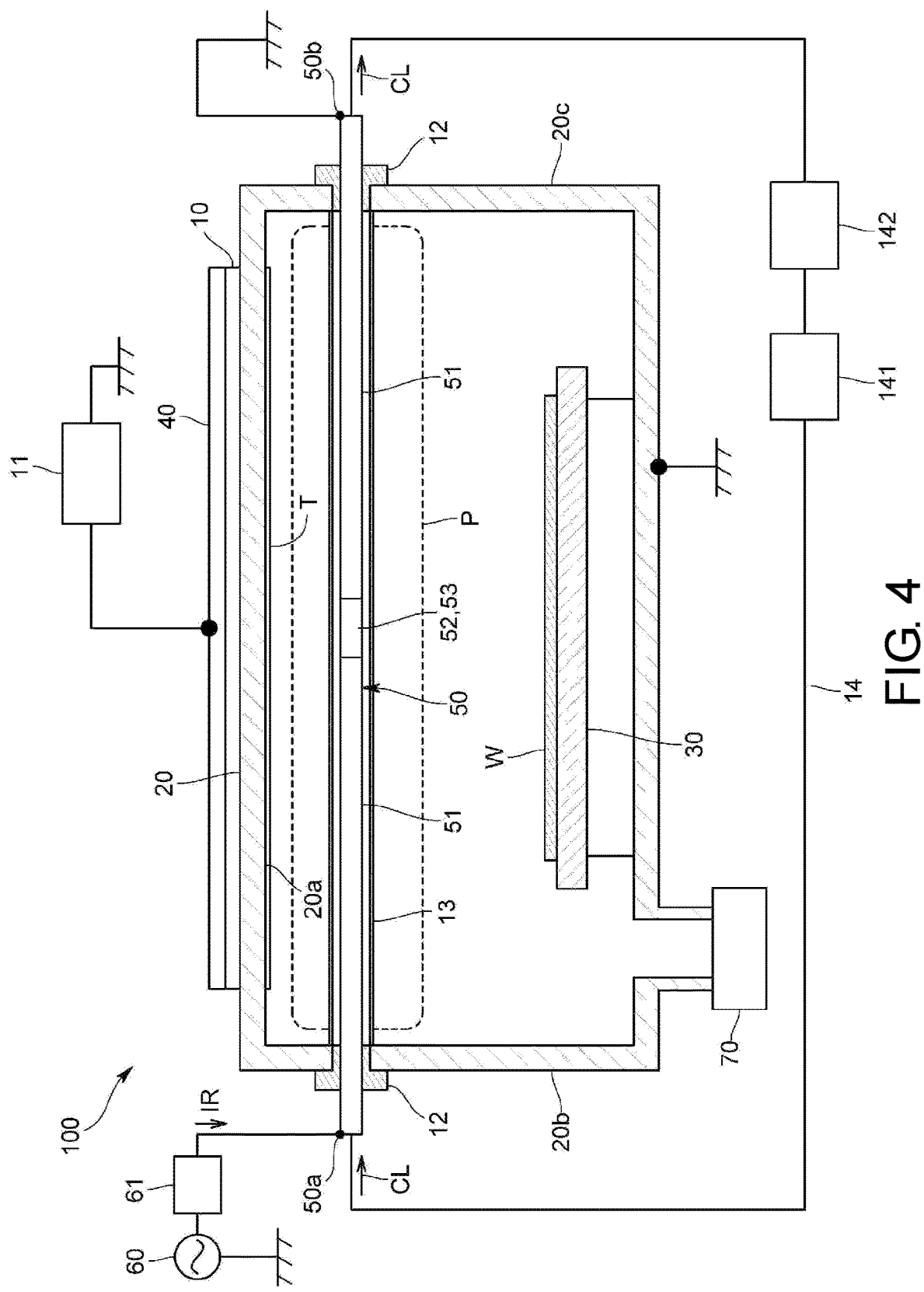
FIG. 4 is a longitudinal sectional view which is along the longitudinal direction of an antenna and illustrates the configuration of the sputtering apparatus of the present embodiment.

Specifically, as shown in FIGS. 3 and 4, the sputtering apparatus 100 includes the vacuum container 20 which is evacuated and into which a gas is introduced, the substrate holding part 30 which holds the substrate W in the vacuum container 20, the target holding part 40 which holds the target T in the vacuum container 20, the plurality of antennas 50 disposed in the vacuum container 20 in a linear shape; and a high frequency power supply 60 which applies high frequency waves for generating inductively coupled plasma P in the vacuum container 20 to the plurality of antennas 50. In addition, by applying the high frequency waves from the high frequency power supply 60 to the plurality of antennas 50, a high frequency current IR flows through the plurality of antennas 50, and an induced electric field is generated in the vacuum container 20 to generate the inductively coupled plasma P.

The vacuum container 20 is a container made of metal for example, the interior of which is evacuated by an evacuation device 70. In this example, the vacuum container 20 is electrically grounded.

The sputtering gas 90 is introduced into the vacuum container 20 via, for example, a sputtering gas supply mechanism 80 having a flow regulator (not shown) or the like and a gas introduction port 21. The sputtering gas 90 is, for example, inert gas such as argon (Ar), or a mixed gas of oxygen and inert gas such as argon. The sputtering gas supply mechanism 80 of the present embodiment selectively supplies argon and the mixed gas of argon and oxygen into the vacuum container 20.

The substrate holding part 30 is a holder that holds the substrate W having a flat plate shape in the vacuum container 20 such that the substrate comes into a horizontal state for example. In this example, the holder is electrically grounded.

The target holding part 40 holds the target T to face the substrate W held by the substrate holding part 30. The target T in this embodiment is a flat-plate-shaped target having a rectangular shape in a plan view and is, for example, an oxide semiconductor material such as InGaZnO. The target holding part 40 is arranged on a side wall 20a (e.g., an upper side wall) forming the vacuum container 20. In addition, an insulating portion 10 having a vacuum sealing function is arranged between the target holding part 40 and the upper side wall 2a of the vacuum container 20. In this example, a target bias power supply 11, which applies a target bias voltage to the target T, is connected to the target T through the target holding part 40. The target bias voltage is a voltage at which ions (Ar+) in the plasma P are attracted to the target and sputtering is performed. The target bias voltage of the present embodiment is a negative voltage of −1 kV or higher, preferably −200 V-600 V.

In this embodiment, a plurality of target holding parts 40 is arranged. The plurality of target holding parts 40 are juxtaposed on the same plane so as to be disposed along the surface of the substrate W (e.g., substantially parallel to a back surface of the substrate W) on a surface side of the substrate W within the vacuum container 20. The plurality of target holding parts 40 is disposed at equal intervals in such a manner that the longitudinal directions are parallel to each other. Thus, as shown in FIG. 3, a plurality of targets T disposed in the vacuum container 20 is disposed at equal intervals in a manner that the plurality of targets T is substantially parallel to the surface of the substrate W and the longitudinal directions are parallel to each other. In addition, the target holding parts 40 have the same configuration.

The plurality of antennas 50 are juxtaposed on the same plane so as to be disposed along the surface of the substrate W (e.g., substantially parallel to the surface of the substrate W) on the surface side of the substrate W within the vacuum container 20. The plurality of antennas 50 is arranged at equal intervals in such a manner that the longitudinal directions are parallel to each other. In addition, each antenna 50 is linear and configured identically in a plan view, and has a length of several tens of centimeters or more.

As shown in FIG. 3, the antennas 50 of the present embodiment are respectively disposed on two sides of the targets T held by the respective target holding parts 40. That is, the antennas 50 and the targets T are alternately arranged with one target T being clamped by two antennas 50. Here, the longitudinal direction of each antenna 50 is the same direction as the longitudinal direction of the target T held by each target holding part 40.

In addition, the antennas 50 are made of, but not limited to, for example, copper, aluminum, alloys of copper and aluminum, stainless steel, etc. In addition, the antenna 50 may be hollow so that a refrigerant such as cooling water flows therein to cool the antenna 50.

In addition, as shown in FIG. 4, the vicinities of two ends of the antenna 50 penetrate through the opposing side walls 20b and 20c of the vacuum container 20, respectively. Insulating components 12 are respectively arranged at portions where the two ends of the antenna 50 pass through the vacuum container 20. The two ends of the antenna 50 penetrate through the respective insulating components 12, and the penetrated portions are vacuum-sealed by, for example, a packing. A space between each insulating component 12 and the vacuum container 20 is also vacuum-sealed by, for example, a packing. In addition, the insulating component 12 is made of, for example, ceramics such as alumina, quartz, or engineering plastics such as polyphenylene sulfide (PPS) and polyetheretherketone (PEEK).

Further, in the antennas 50, the portions located in the vacuum container 20 are covered by straight tubular insulating covers 13 made of insulators. Spaces between two ends of the insulating cover 13 and the vacuum container 20 may not be sealed. The reason is that, even if the sputtering gas 90 enters the space in the insulating cover 13, the space is small and the moving distances of electrons are short, and thus plasma P is generally not generated in the space. In addition, the insulating cover 13 is made of, but not limited to, for example, quartz, alumina, fluorinated resin, silicon nitride, silicon carbide, silicon, etc.

A power supply end portion 50a, which is one end portion of the antenna 50, is connected with the high frequency power supply 60 via a matching circuit 61, and a terminal portion 50b, which is the other end portion, is directly grounded. In addition, an impedance adjusting circuit such as a variable capacitor or a variable reactor may be arranged on the power supply end portion 50a or the terminal portion 50b to adjust the impedance of each antenna 50. By adjusting the impedance of each antenna 50 as described above, the density of the plasma P in the longitudinal direction of the antenna 50 can be distributed uniformly, and the film thickness in the longitudinal direction of the antenna 50 can be uniform.

According to the above configuration, the high frequency current IR can flow from the high frequency power supply 60 to the antenna 50 via the matching circuit 61. The frequency of the high frequency is typically, but not limited to, 13.56 MHz, for example.

Figure 5:
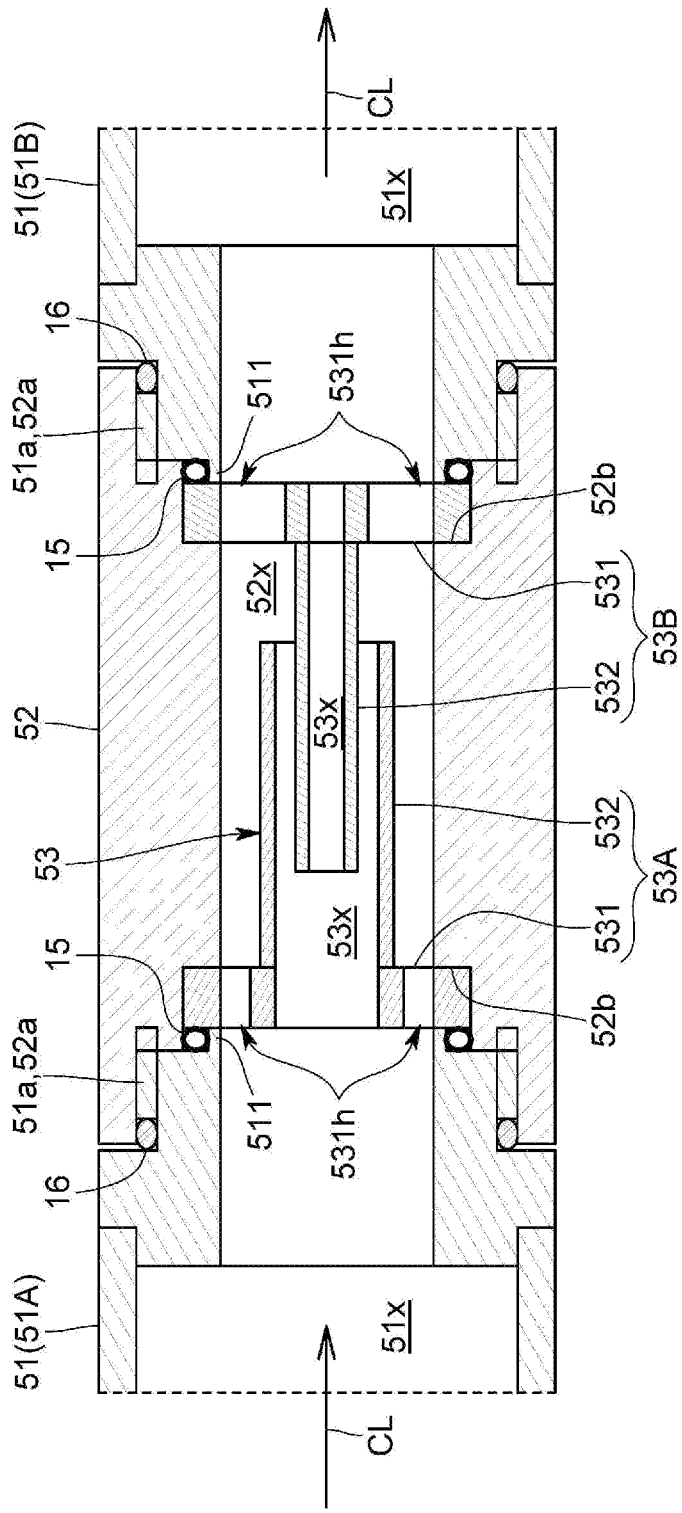
FIG. 5 is an enlarged partial sectional view showing a capacitor portion in the antenna of the present embodiment.

Besides, the antenna 50 of the present embodiment has a hollow structure having a flow path in which a cooling liquid CL flows. Specifically, as shown in FIG. 5, the antenna 50 includes at least two conductor elements 51 having a tubular shape and made of metal (hereinafter, referred to as "metal pipes 51"), a tubular insulating element 52 (hereinafter, referred to as "insulating pipe 52") arranged between the adjacent metal pipes 51 to insulate the metal pipes 51, and a capacitance element, i.e., a capacitor 53, electrically connected in series with the adjacent metal pipes 51.

In this embodiment, there are two metal pipes 51, one insulating pipe 52 and one capacitor 53. In the following description, one of the metal pipes 51 is also referred to as a "first metal pipe 51A", and the other metal pipe is also referred to as a "second metal pipe 51B". In addition, the antenna 50 may also be configured to have three or more metal pipes 51, in which case the numbers of the insulating pipe 52 and the capacitor 53 are one less than the number of the metal pipes 51.

In addition, the cooling liquid CL is circulated in the antenna 50 through a circulation flow path 14 arranged outside the vacuum container 20, and a temperature adjusting mechanism 141 such as a heat exchanger or the like for adjusting the cooling liquid CL to a fixed temperature and a circulation mechanism 142 such as a pump or the like for circulating the cooling liquid CL in the circulation flow path 14 are arranged in the circulation flow path 14. From the viewpoint of electrical insulation, high-resistance water is preferably used as the cooling liquid CL, for example, pure water or water similar to pure water is preferable. In addition, liquid refrigerants other than water, such as fluorinated inert liquids, may also be used.

The metal pipe 51 has a straight tube shape in which a linear flow path 51x through which the cooling liquid CL flows is formed. Besides, an external thread portion 51a is formed at an outer peripheral portion of at least one end portion in the longitudinal direction of the metal pipe 51. In the metal pipe 51 of the present embodiment, the end portion with the external thread portion 51a formed thereon and other components are formed from different components and are joined, but the end portion and other components may also be formed from a single component. In addition, in order to achieve the universality with a configuration configured to connect a plurality of metal pipes 51, it is desirable that the external thread portions 51a are formed at two end portions in the longitudinal direction of the metal pipes 51 to have interchangeability. The metal pipes 51 are made of, for example, copper, aluminum, alloys of copper and aluminum, stainless steel, etc.

The insulating pipe 52 has a straight tube shape in which a linear flow path 52x through which the cooling liquid CL flows is formed. Besides, internal thread portions 52a screwed and connected to the external thread portions 51a of the metal pipes 51 are formed on side peripheral walls of two axial end portions of the insulating pipe 52. In addition, on the side peripheral walls of the two axial end portions of the insulating pipe 52, recesses 52b for fitting electrodes 53A and 53B of the capacitor 53 are formed across the entire circumferential direction closer to the central side in the axial direction than the internal screw portion 52a. The insulating pipe 52 of the present embodiment is formed of a single component, but is not limited thereto. In addition, the insulating pipe 52 is made of, for example, alumina, fluorinated resin, polyethylene (PE), and engineering plastic (for example, polyphenylene sulfide (PPS) and polyetheretherketone (PEEK)), and the like.

The capacitor 53 is arranged in the insulating pipe 52, specifically, in the flow path 52x through which the cooling liquid CL in the insulating pipe 52 flows.

Specifically, the capacitor 53 includes a first electrode 53A electrically connected with one of the adjacent metal pipes 51 (the first metal pipe 51A), and a second electrode 53B electrically connected with the other one of the adjacent metal pipes 51 (the second metal pipe 51B) and disposed facing the first electrode 53A, and the capacitor 53 is configured such that a space between the first electrode 53A and the second electrode 53B is filled with the cooling liquid CL. That is, the cooling liquid CL flowing through the space between the first electrode 53A and the second electrode 53B becomes a dielectric constituting the capacitor 53.

The electrodes 53A and 53B have a substantial rotating body shape, and a main flow path 53x is formed at a central portion along central axes thereof. Specifically, the electrodes 53A and 53B have flange portions 531 in electrical contact with the end portions on the insulating pipe 52 side in the metal pipes 51, and extension portions 532 extending from the flange portions 531 toward the insulating pipe 52 side. In each of the electrodes 53A and 53B of the present embodiment, the flange portion 531 and the extension portion 532 may be formed of a single component, or may be formed of different components and be joined. The electrodes 53A and 53B are made of, for example, aluminum, copper and alloys of aluminum and copper.

The flange portions 531 are in contact with the end portions on the insulating pipe 52 side of the metal pipe 51 across the entire circumferential direction. Specifically, axial end surfaces of the flange portions 531 are in contact with front end surfaces of cylindrical contact portions 511 formed at the end portions of the metal pipes 51 across the entire circumferential direction, and are in electrical contact with the end surfaces of the metal pipes 51 through annular multi-face contactor 15 arranged at the outer periphery of the contact portions 511 of the metal pipes 51. In addition, the flange portions 531 may come into electrical contact with the metal pipes 51 through any one of the connections described above.

In addition, a plurality of through holes 531h is formed in the thickness direction of the flange portions 531. By forming the through holes 531h in the flange portions 531, the flow path resistance of the cooling liquid CL caused by the flange portions 531 can be reduced, and the stagnation of the cooling liquid CL in the insulating pipe 52 and the accumulation of bubbles in the insulating pipe 52 are prevented.

The extension portion 532 has a cylindrical shape and a main flow path 53x is formed inside. The extension portion 532 of the first electrode 53A and the extension portion 532 of the second electrode 53B are disposed coaxially with each other. That is, the extension portion 532 of the second electrode 53B is arranged to be inserted into the extension portion 532 of the first electrode 53A. Thereby, a cylindrical space along the flow path direction is formed between the extension portion 532 of the first electrode 53A and the extension portion 532 of the second electrode 53B.

The electrodes 53A and 53B thus configured are fitted into the recesses 52b formed in the side peripheral walls of the insulating pipe 52. Specifically, the first electrode 53A is fitted into the recess 52b formed at one axial end side of the insulating pipe 52, and the second electrode 53B is fitted into the recess 52b formed at the other axial end side of the insulating pipe 52. By fitting the electrodes 53A and 53B into the respective recesses 52b as described above, the extension portion 532 of the first electrode 53A and the extension portion 532 of the second electrode 53B are disposed coaxially with each other. In addition, the insertion dimension of the extension portion 532 of the second electrode 53B relative to the extension portion 532 of the first electrode 53A is defined by end surfaces of the flange portions 531 of the electrode 53A and the electrode 53B coming into contact with surfaces of the recesses 52b directed axially outward.

In addition, by fitting the electrodes 53A and 53B into the respective recesses 52b of the insulating pipe 52, and screwing the external thread portions 51a of the metal pipes 51 with the internal thread portions 52a of the insulating pipe 52, the front end surfaces of the contact portions 511 of the metal pipes 51 are in contact with the flange portions 531 of the electrode 53A and 53B, and the electrodes 53A and 53B are clamped and fixed between the insulating pipe 52 and the metal pipes 51. Thus, the antenna 50 of the present embodiment becomes a structure in which the metal pipes 51, the insulating pipe 52, the first electrode 53A, and the second electrode 53B are disposed coaxially. In addition, connection portions of the metal pipes 51 and the insulating pipe 52 have sealing structures for the vacuum and the cooling liquid CL. The sealing structures of this embodiment are realized by sealing components 16 such as packings arranged at base end portions of the external thread portions 51a. In addition, a tapered thread structure for a tube may also be used.

As described above, the sealing between the metal pipes 51 and the insulating pipe 52, and the electrical contact between the metal pipes 51 and the electrodes 53A and 53B are performed together with the fastening of the external thread portions 51a and the internal thread portions 51a, and thus assembling operation becomes very simple.

In this configuration, after the cooling liquid CL flows out of the first metal pipe 51A, the cooling liquid CL flows to the side of the second electrode 53B through the main flow path 53x and the through holes 531h of the first electrode 53A. The cooling liquid CL flowing to the side of the second electrode 53B flows to the second metal pipe 51B through the main flow path 53x and the through holes 531h of the second electrode 53B. At this time, the cylindrical space between the extension portion 532 of the first electrode 53A and the extension portion 532 of the second electrode 53B is filled with the cooling liquid CL, and the cooling liquid CL becomes a dielectric to constitute the capacitor 53.

According to the sputtering apparatus 100 of the present embodiment configured as described above, since the capacitor 53 is electrically connected in series with the metal pipes 51 adjacent to each other via the insulating pipe 52, to be simply put, synthetic reactance of the antenna 50 is obtained by subtracting capacitive reactance from inductive reactance, and the impedance of the antenna 50 can be reduced. As a result, even in the case of extending the antenna 50, an increase in the impedance of the antenna 50 can be inhibited, high frequency current easily flows in the antenna 50, and the plasma P can be efficiently generated. Accordingly, the density of the plasma P can be increased, and the film formation speed can also be increased.

Particularly, according to the present embodiment, the space between the first electrode 53A and the second electrode 53B is filled with the cooling liquid CL and used as the dielectric, and thus a gap generated among the electrode 53A, the electrode 53B and the dielectric constituting the capacitor 53 can be eliminated. As a result, the uniformity of the plasma P can be improved, and the uniformity of the film formation can be improved. In addition, by using the cooling liquid CL as the dielectric, there is no need to prepare a liquid dielectric different from the cooling liquid CL, and the first electrode 53A and the second electrode 53B can be cooled. The cooling liquid CL is adjusted to the fixed temperature by the temperature adjustment mechanism, and by using the cooling liquid CL as the dielectric, it is possible to prevent a change in relative dielectric constant caused by a temperature change and prevent a change in a capacitance value, thereby also improving the uniformity of the plasma P. In addition, in the case that water is used as the cooling liquid CL, because the relative dielectric constant of water is about 80 (20° C.) and greater than that of a dielectric sheet made of resin, the capacitor 53 capable of withstanding a high voltage can be formed.

Further, according to the present embodiment, the setting of the high frequency voltage supplied to the antennas and the bias voltage to the target can be independently performed, so that it is possible to set the bias voltage to a low voltage independently from generation of the plasma P to the extent that ions in the plasma P are attracted to the target T such that sputtering is performed. As a result, since the sputtering of the target T can be performed at a low voltage, variations in the material composition of the target T and the composition of the film formed on the substrate W can be reduced. In addition, since the antennas 50 are used to generate the plasma P for sputtering, the target T can be consumed the same as in a magnetron sputtering apparatus, and the use efficiency of the target T can be improved. In addition, the present embodiment has a configuration with no direct current magnetic field in the vicinity of the target surface and is easily applied to a magnetic material.

In addition, arc discharge possibly generated in the gap among the electrode 53A, the electrode 53B and the dielectric may be eliminated, and the breakage of the capacitor 53 caused by arc discharge may be eliminated. In addition, the capacitance value can be set with high precision according to the distance and facing surface area between the first electrode 53A and the second electrode 53B and the relative dielectric constant of the cooling liquid CL, regardless of the gap. Further, a structure for pressing the electrode 53A, the electrode 53B and the dielectric to fill the gap is not required, and the complexity of a structure around the antenna caused by the pressing structure and the deterioration of the uniformity of the plasma P caused accordingly can be prevented.

<Evaluation of Relationship Between Target Bias Voltage and Film Formation Speed>

In the sputtering apparatus 100 of the present embodiment, the relationship between the target bias voltage (V) and the film formation speed (nm/min) is evaluated. In addition, the target T used is IGZO 1114 with a size of 150 mm×1000 mm. The inter-antenna distance (pitch width) is 200 mm. The distance between the target and the substrate is 125 mm. The size of the substrate W is 320 mm×400 mm.

After the vacuum container 20 is evacuated to $3\times10^{-6}$ Torr or lower, the pressure in the vacuum container 20 is adjusted to 1.3 Pa while 100 sccm of sputtering gas (Ar) is introduced. High frequency power of 5 kW, 7 kW or 8 kW is supplied to the plurality of antennas 50 to generate and maintain inductively coupled plasma. A direct current voltage pulse (50 kHz, duty 97%) is applied to the target T to perform the sputtering of the target T and measure the film formation speed.

Figure 6:
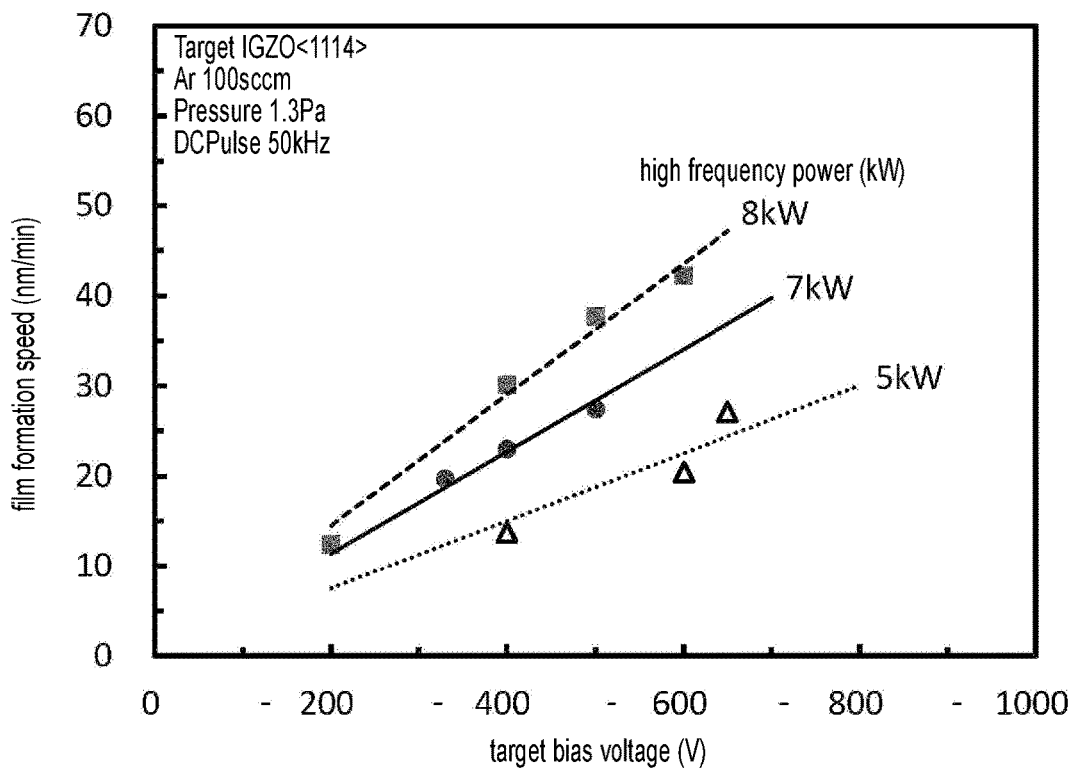
FIG. 6 is a graph showing a relationship between a sputtering bias voltage and a film formation speed.

The film formation speed for each target bias voltage at each high frequency power is shown in FIG. 6. For example, in a case that the sputtering is required to be performed at a film formation speed of 25 nm/min, the target bias voltage may be set to −665 V when the high frequency power is 5 kW, to −440 V when the high frequency power is 7 kW, and to −344 V when the high frequency power is 8 kW.

<Evaluation of Film Formation Speed Due to Oxygen Concentration>

Using the sputtering apparatus 100 of the present embodiment, the film formation speed when argon and oxygen are supplied together into the vacuum container is evaluated. In addition, the target T used is IGZO1114 with a size of 150 mm×1000 mm. The inter-antenna distance (pitch width) is 200 mm. The distance between the target and the substrate is 125 mm. The size of the substrate W is 320 mm×400 mm.

After the vacuum container 20 is evacuated to $3\times10^{-6}$ Torr or lower, the pressure in the vacuum container 20 is adjusted to 0.9 Pa while 100 sccm of a mixed gas (argon and oxygen) is introduced. High frequency power of 7 kW or 8 kW is supplied to the plurality of antennas 50 to generate and maintain inductively coupled plasma P. A direct current voltage pulse (50 kHz, duty 97%) of −400 V is applied to the target T to perform the sputtering of the target T and measure the film formation speed.

Figure 7:
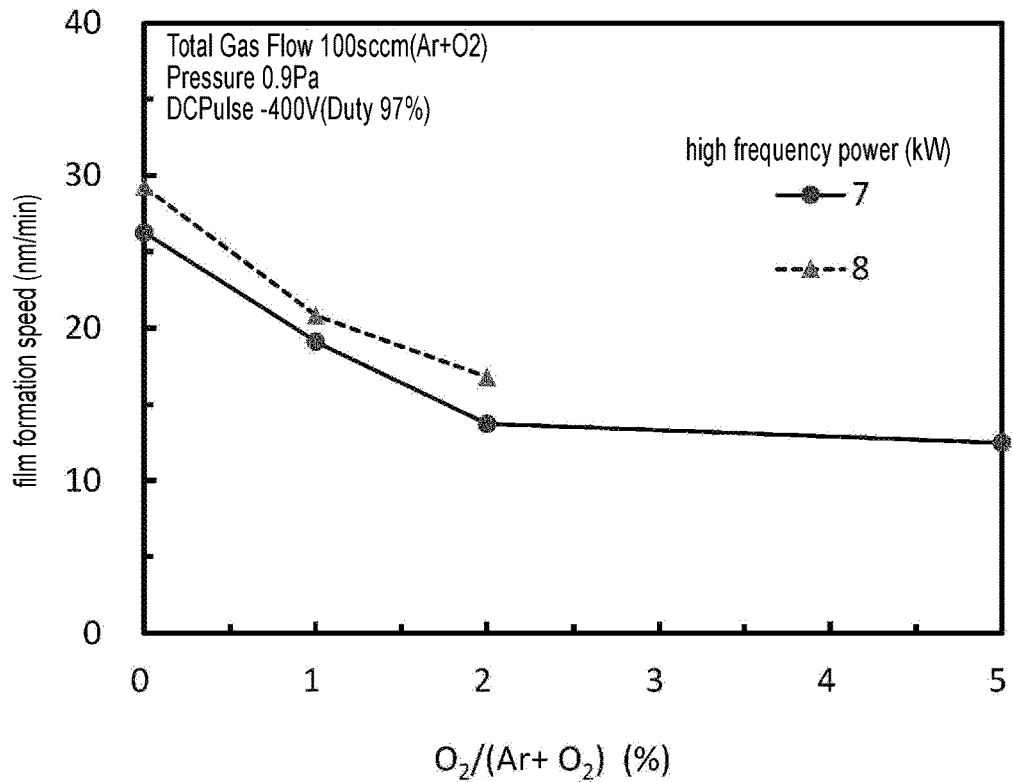
FIG. 7 is a graph showing a relationship between the concentration of oxygen and the film formation speed.

FIG. 7 shows the film formation speed when the concentration of oxygen is changed in each high frequency power. As seen from FIG. 7, it is evident that the film formation speed slows down as the concentration of oxygen increases and the film formation speed is the greatest when only argon is supplied for film formation.

<Evaluation of Oxygen Binding State of IGZO Film>

The oxygen bonding state of the IGZO film (the IGZO film of the present invention) formed using the sputtering apparatus 100 of the present embodiment is analyzed using an X-ray photoelectron spectroscopy analysis apparatus (XPS analysis apparatus (KATOS AXIS-ULTRA manufactured by Shimadzu Corporation)). In addition, as a comparative example, the oxygen bonding state of the IGZO film (the IGZO film of the conventional example) formed using the RF magnetron sputtering apparatus of the conventional mode (ESS-300 manufactured by EIKO Co., Ltd.) is analyzed using the XPS analysis apparatus described above.

IGZO Film of the Present Invention:

After the vacuum container 20 is evacuated to $3\times10^{-6}$ Torr or lower, the pressure in the vacuum container 20 is adjusted to 1.3 Pa while 100 sccm of the sputtering gas (only Ar) is introduced. High frequency power of 7 kW is supplied to the plurality of antennas 50 to generate and maintain inductively coupled plasma P. A direct voltage pulse (50 kHz, duty 97%) of −400 V is applied to the target T to perform sputtering on the target T (IGZO1114) and form a film.

IGZO Film of Conventional Example

After the vacuum container is evacuated to $3 \times 10^{-6}$ Torr or lower, the pressure in the pressure container in the vacuum container is adjusted to 0.6 Pa while 19.1 sccm of the sputtering gas (Ar) and 0.9 sccm of oxygen (a mixed gas having an oxygen concentration of 4.5%) are introduced. High frequency power of 100 W is supplied to the cathode to perform sputtering on the target T (IGZO1114) and form a film.

Figure 8:
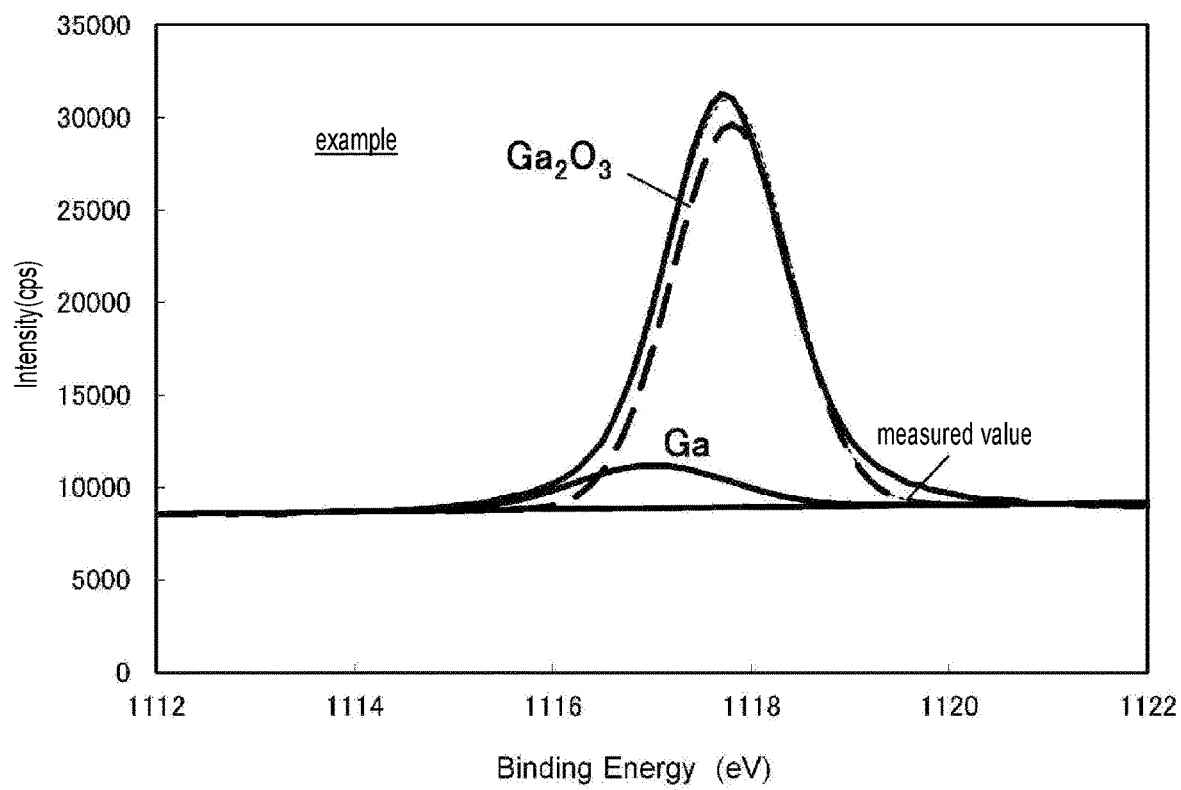
FIG. 8 is a graph showing XPS spectra of $Ga2p_{3/2}$ in an IGZO film according to the present invention and an IGZO film of a conventional example.
Figure 8:
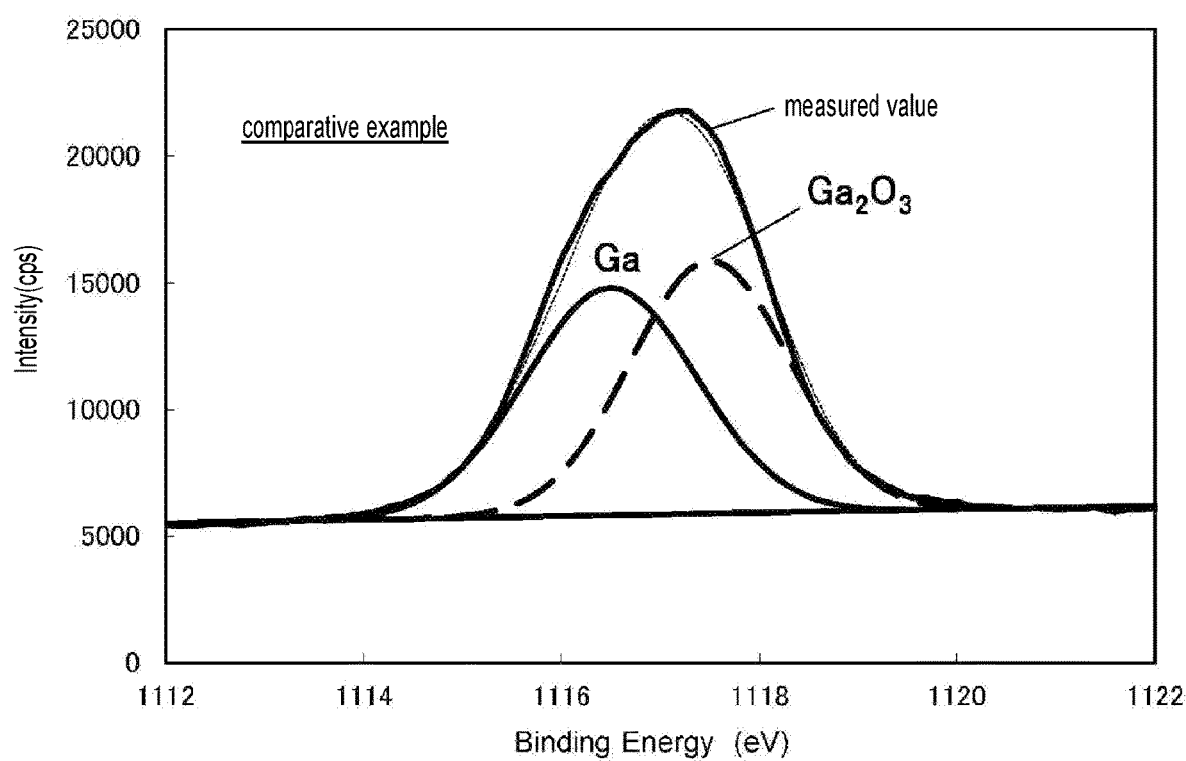

FIG. 8 shows an XPS spectrum of $Ga2p_{3/2}$ obtained by the XPS analysis apparatus. In addition, FIG. 9 is a graph showing the proportions of components obtained by performing peak separation on XPS spectrum of $Ga2p_{3/2}$, XPS spectrum of $In3d_{5/2}$, and XPS spectrum of $Zn2p_{3/2}$.

Figure 9:
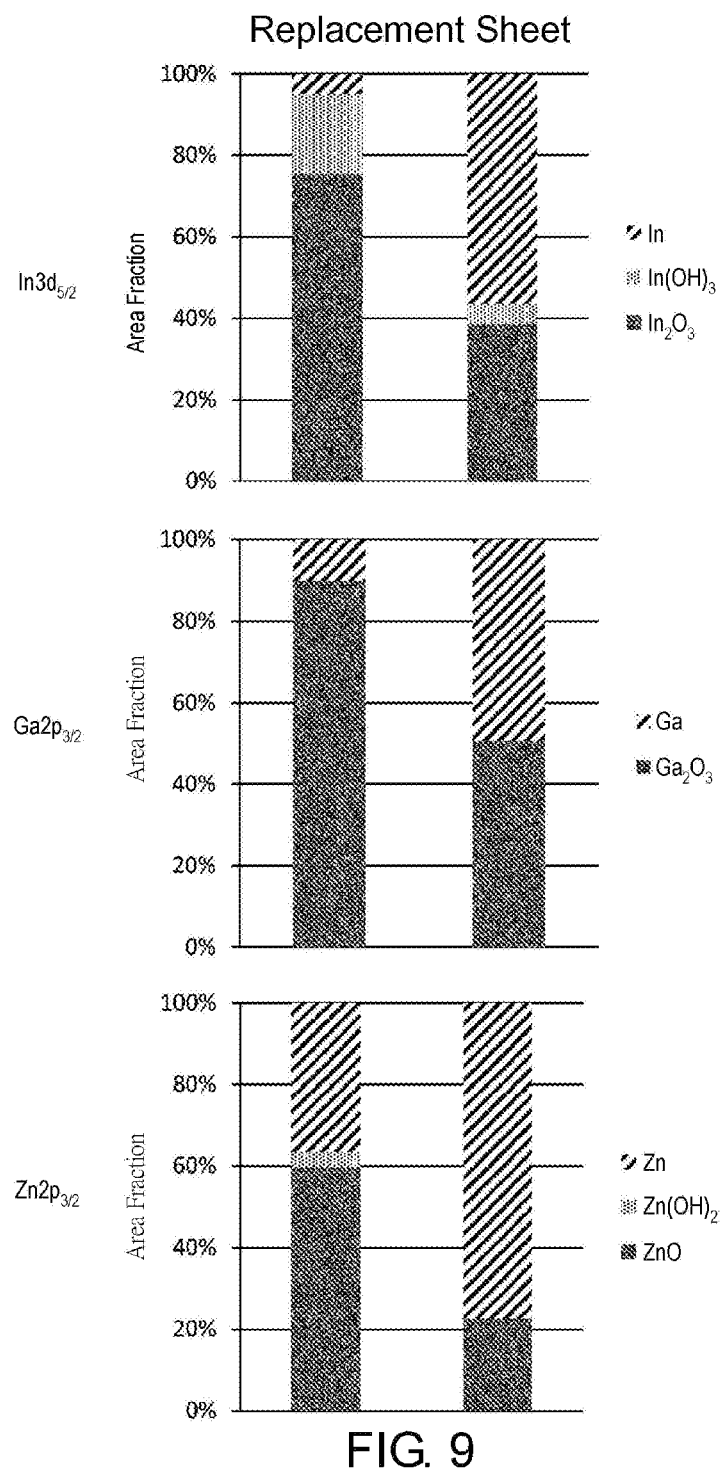
FIG. 9 is a graph showing the proportions of components in the IGZO film according to the present invention and the IGZO film of the conventional example.

As seen from FIGS. 8 and 9, by using the sputtering apparatus 100 of the present embodiment, even if a reactive gas (oxygen) is not added, a film in which 60% or more of metal elements are combined with oxygen can be formed.

<Evaluation of Voltage Resistance of Thin Film Transistor>

In order to confirm the electrical characteristics of the thin film transistor made by the producing method of this embodiment, a negative bias stress test is performed as follows.

(Sample Preparation)

Four bottom-gate thin film transistors (Samples 1 to 4) using low resistance silicon substrates as gate electrodes are prepared. In each sample, a gate insulating layer composed of $SiO_2$ and having a film thickness of 100 nm is arranged on the gate electrode of the low resistance silicon substrate, an oxide semiconductor layer composed of an IGZO film (IGZO 1114) is arranged on the gate insulating layer, and a source electrode, a drain electrode (Pt: 20 nm, Mo: 80 nm) and a protective film ($SiO_2$) are arranged on the oxide semiconductor layer.

In Sample 1, a single layer of an oxide semiconductor layer having a film thickness of 50 nm is formed using a conventional high frequency magnetron sputtering apparatus, and finally heat-treatment is performed in an oxygen atmosphere at 300° C. for 2 hours.

In Samples 2 to 4, an oxide semiconductor layer is formed using the sputtering apparatus 100 described above.

In Sample 2, a direct current pulse voltage of −350 V is applied to the target, plasma generation is performed using high frequency antennas, sputtering is performed at room temperature with only argon supplied as the sputtering gas, and a single layer of an oxide semiconductor layer having a film thickness of 50 nm is formed. Finally, heat treatment is performed in oxygen atmosphere at 300° C. for 2 hours.

In Sample 3, a single layer of the oxide semiconductor layer is formed under the same conditions as in Sample 2, and finally heat treatment is performed in oxygen atmosphere at 250° C. for 2 hours.

In Sample 4, first, a direct current pulse voltage of −350 V is applied to the target, plasma generation is performed using high frequency antennas, sputtering is performed at room temperature with only argon supplied as the sputtering gas, and the first semiconductor layer having a thickness of 45 nm is formed. Then, the mixed gas of argon and oxygen (concentration: 5%) is supplied as the sputtering gas to perform sputtering at room temperature, and the second semiconductor layer having a thickness of 5 nm is formed on the first semiconductor layer. Then, finally, heat treatment is performed in oxygen atmosphere at 250° C. for 2 hours.

(Negative Bias Stress Test)

For the produced Samples 1 to 4, the negative bias stress test is performed according to the following conditions, and the shift amount ($\Delta V_{th}(V)$) of the threshold voltage with respect to the stress time (sec) is measured. The test results are shown in FIG. 10.

Figure 10:
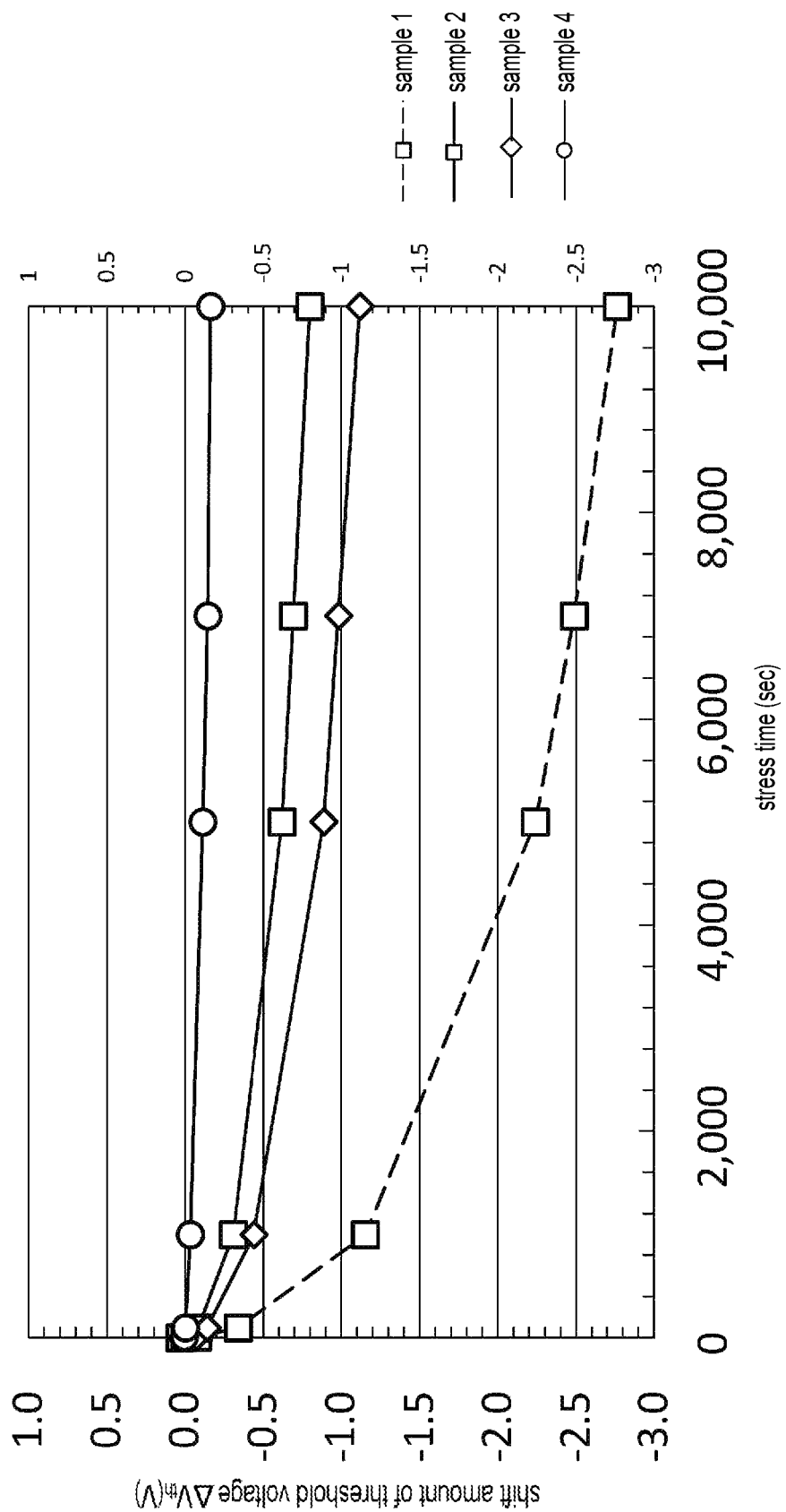
FIG. 10 is a graph showing a relationship between stress time and a shift amount of threshold voltage based on a negative bias stress test.

Gate application voltage: −20V
Stress time: 1 s to 10000 s
Voltage between drain electrode and source electrode: 5.0 V As seen from the results shown in FIG. 10, in Sample 4 produced by the producing method of the present embodiment in which the oxide semiconductor layer is a two-layer structure, the shift amount $\Delta V_{th}$ of the threshold voltage becomes very small and more stable with respect to electrical stress. It can be seen that the results are better compared with the results of Sample 1 in which the oxide semiconductor layer is formed by the conventional magnetron sputtering apparatus and Sample 2 and Sample 3 in which a single layer of the oxide semiconductor layer is formed by the sputtering apparatus 100 of the present embodiment.

Figure 11:
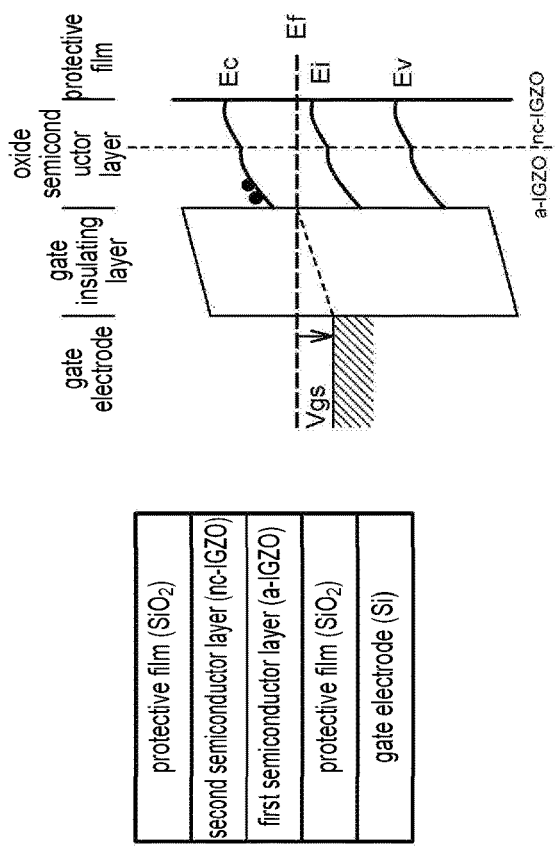
FIG. 11 is a diagram schematically illustrating structures of thin film transistors of Samples 2 to 4 created in the negative bias stress test.
Figure 11:
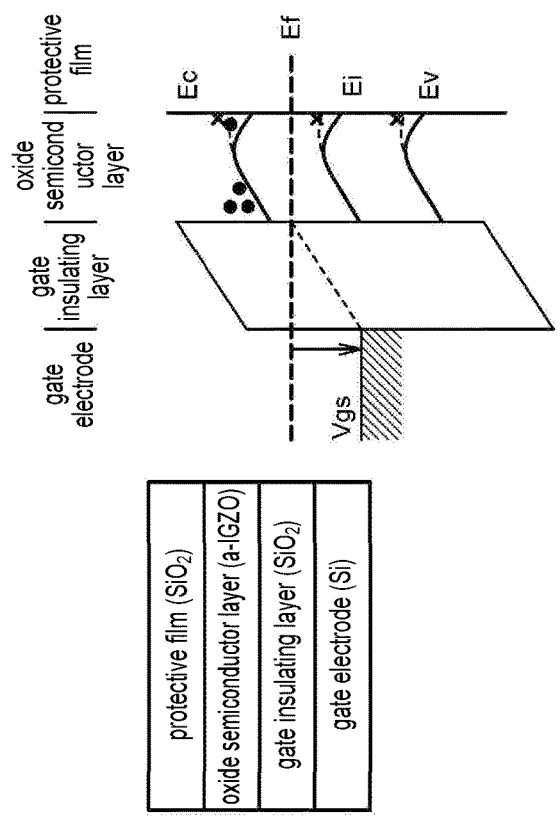

In addition, in the thin film transistors of Sample 2 and Sample 3 in which a single layer of the oxide semiconductor layer is formed, as shown in (a) of FIG. 11, defects are easily generated at an interface of the oxide semiconductor layer (a-IGZO) and the protective film ($SiO_2$). Therefore, even in the state of zero gate voltage $V_{gs}$, carriers are generated in the channel layer and the current flows. The thin film transistor cannot be set to an off state without applying, as the gate voltage $V_{gs}$, a negative voltage that eliminates the fixed charges caused by the defects generated at the interface.

On the other hand, in the thin film transistor of Sample 4 in which the oxide semiconductor layer is formed into a two-layer structure, the second semiconductor layer formed by sputtering using a mixed gas of argon and oxygen as the sputtering gas is a crystalline oxide semiconductor (nc-IGZO). Therefore, as shown in (b) of FIG. 11, even if the protective film ($SiO_2$) is formed on the upper surface, defects are less prone to generate at the interface thereof, so are the fixed charges. Therefore, it is considered that no carriers are generated in the channel layer in the state of zero gate electrode $V_{gs}$, and therefore, the thin film transistor can be set to an off state even if no high negative voltage is applied as the gate electrode voltage $V_{gs}$.

In addition, it can be seen that by changing the oxygen concentration in the sputtering gas, the amount of oxygen in the second semiconductor layer changes, and thereby the crystallinity of the second semiconductor layer can be changed. Accordingly, it is also known that when the protective film is formed on the upper surface of the second semiconductor layer, the generation of defects in the interface can be controlled, and the position of the threshold voltage $V_{th}$ can be changed. In addition, since the first semiconductor layer and the second semiconductor layer are formed in approximately the same elemental ratio, their interface is in a so-called homojunction state and is not a discontinuous structure that generates defects or fixed charges, and thus an influence of the thin film transistor on switching operations is less prone to generate.

Effects of this Embodiment

According to the method for producing the thin film transistor of the present embodiment configured as described above, since the bias voltage applied to the target is lower than the bias voltage in the past (e.g., −1 kV −2 kV), the generation of sputtered particles from which oxygen has escaped can be inhibited. As a result, a film maintaining the same oxide state as the target material is formed on the substrate, and a high-quality film can be formed.

In addition, since the bias voltage applied to the target is low, the sputtered particles from which oxygen has not escaped reach the substrate. As a result, it is possible that only argon is supplied as the sputtering gas to perform sputtering, and thus the film formation speed can be increased compared to the case that oxygen is supplied in addition to argon.

Further, the oxide semiconductor layer having a large amount of oxygen in the film can be formed by having the second film formation step in which the mixed gas of argon and oxygen is supplied as the sputtering gas. As a result, the oxygen deficiency of the oxide semiconductor layer can be prevented, and a thin film transistor having excellent electrical characteristics can be produced.

Other Modified Embodiment

In addition, the present invention is not limited to the above-described embodiments.

For example, the thin film transistor 1 of the above-described embodiment has a bottom gate structure, but the thin film transistor is not limited thereto and may also have a top gate structure.

In the thin film transistor 1 of the above-described embodiment, the second semiconductor layer 5b is arranged on the first semiconductor layer 5a; however, the first semiconductor layer 5a may also be arranged on the second semiconductor layer 5b. In this case, in the "step of forming the oxide semiconductor layer" of the producing method, the second film formation step may be performed first, and then the first film formation step is performed.

Figure 12:
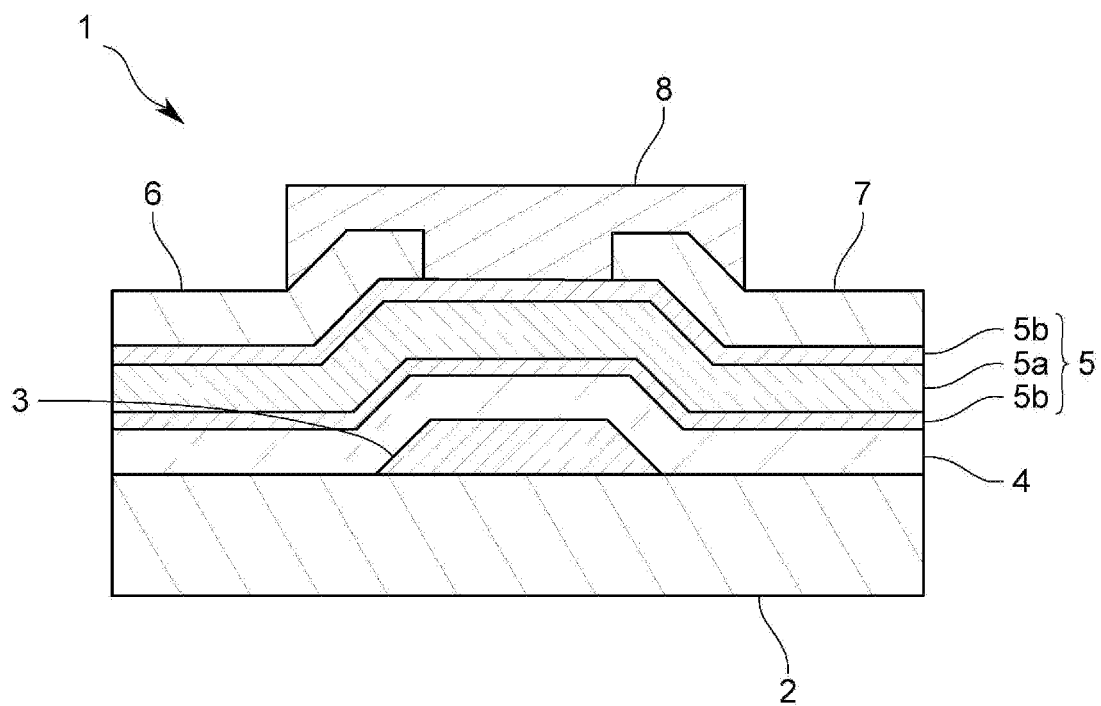
FIG. 12 is a longitudinal sectional view schematically showing a configuration of a thin film transistor of a modification embodiment.

The oxide semiconductor layer 5 of the thin film transistor 1 of the above-described embodiment has a two-layer structure in which the second semiconductor layer 5b is arranged on the first semiconductor layer 5a; however, as shown in FIG. 12, the oxide semiconductor layer may also have a three-layer structure in which the first semiconductor layer 5a is arranged between two second semiconductor layers 5b. In this case, in the "step of forming the oxide semiconductor layer" of the producing method, the second film formation step may be performed first, followed by the first film formation step, then followed by the second film formation step.

In the sputtering apparatus 100 of the above-described embodiment, the antenna has a linear shape; however, the antenna may also have a curved or bent shape. In this case, the metal pipe may have a curved or bent shape, and the insulating pipe may have a curved or bent shape.

In the sputtering apparatus 100 of the above-described embodiment, the extension portions of the electrodes have a cylindrical shape; however, the extension portions may be other square cylindrical shapes, or may be a flat plate shape or a curved or bent plate shape.

Figure 13:
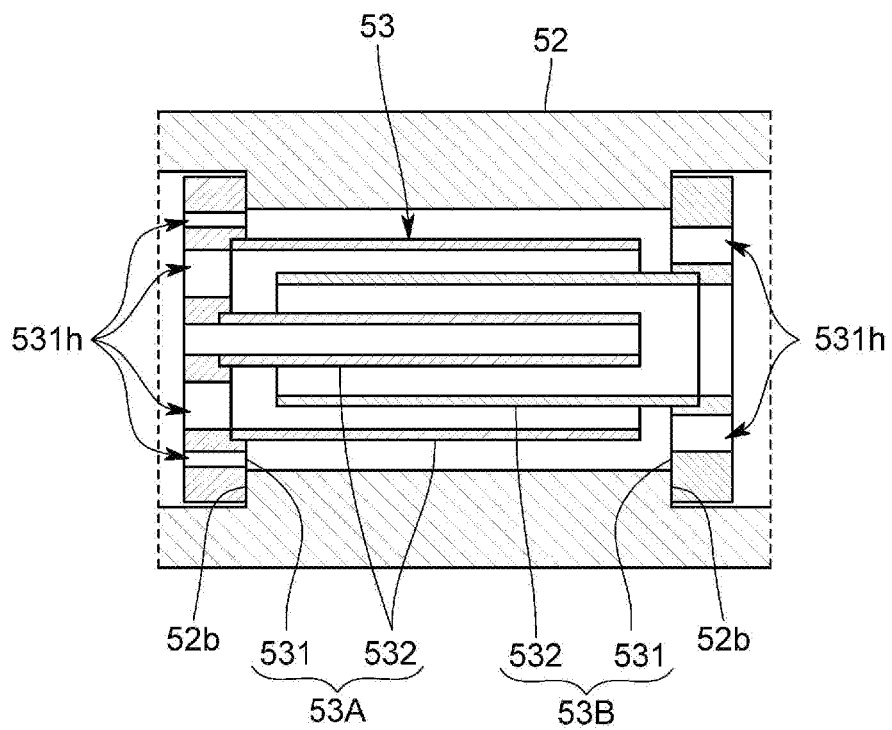
FIG. 13 is an enlarged partial cross-sectional view showing a capacitor portion in an antenna of the modification embodiment.

In the sputtering apparatus 100 of the above-described embodiment, the capacitor 53 has a double-cylinder structure composed of two cylindrical extension portions; however, as shown in FIG. 13, three or more cylindrical extension portions 532 may be arranged coaxially. In this case, the extension portion 532 of the first electrode 53A and the extension portion 532 of the second electrode 53B are alternately disposed. In FIG. 13, among the three extension portions 532, the two on the inner side and the outer side are the extension portions 532 of the first electrode 53A, and the one in the middle is the extension portion 532 of the second electrode 53B. According to this configuration, the facing surface area can be increased without increasing the axial dimension of the capacitor 53.

Figure 14:
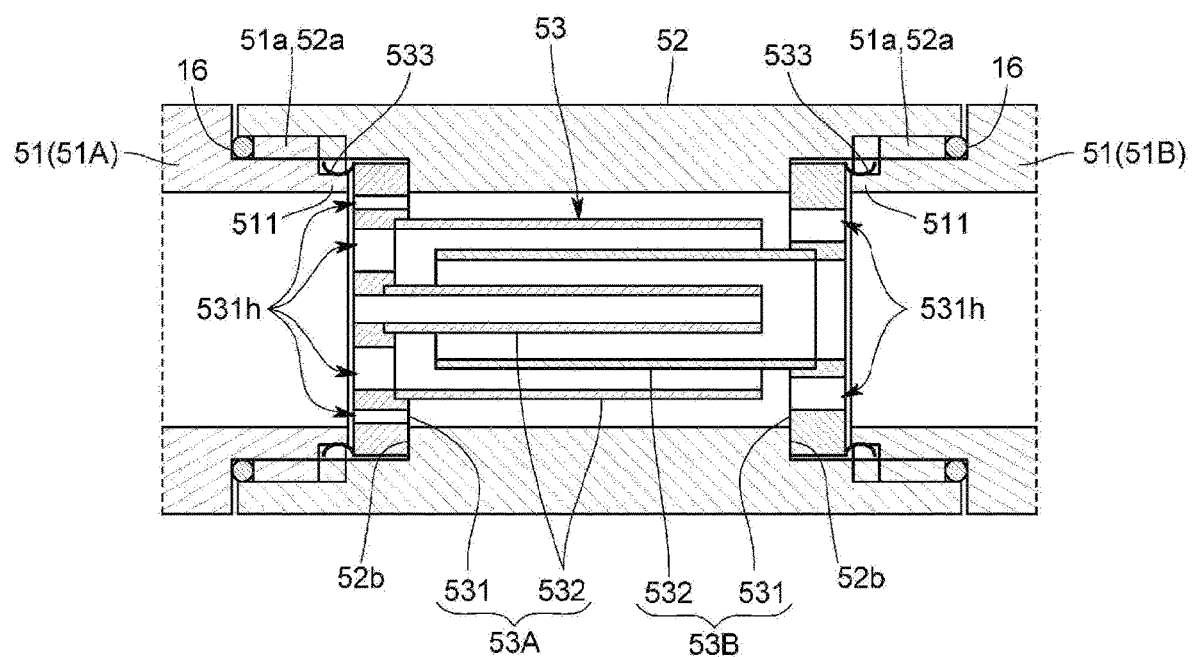
FIG. 14 is an enlarged partial cross-sectional view showing a capacitor portion in an antenna of the modification embodiment.

Further, in the sputtering apparatus 100, as for the contact between the electrode 53A and 53B and the metal pipes 51, in addition to the contact between end surfaces thereof, as shown in FIG. 14, contact terminals 533 may be arranged on the electrode 53A and 53B, and the contact terminals 533 are brought into contact with the metal pipes 51. In the configuration of FIG. 14, the contact terminals 533 protruding axially outward from the flange portions 531 of the electrodes 53A and 53B are arranged, and the contact terminals 533 are pressed to come into contact with the outer peripheral surfaces of the contact portions 511 of the metal pipes 51. In this configuration, relative positions of the electrodes 53A and 53B are defined by surfaces of the recesses 52b of the insulating pipe 52 directed axially outward.

Further, a portion of the metal unit 51 on one side of the insulating element 52 may also be used as the first electrode 53A. In this case, it is considered that the second electrode 53B electrically connected with the metal unit 51 on the other side of the insulating element 52 has a structure of extending to the interior of the metal unit 51 on one side of the insulating element 52 through the interior of the insulating element 52.

In addition, the conductor element and the insulating element are tubular units having one internal flow path; however, the conductor element and the insulating element may also be units having two or more internal flow paths or branched internal flow paths.

The sputtering apparatus 100 of the above-described embodiment has a configuration having a plurality of target holding parts; however, the sputtering apparatus may also be a configuration having one target holding part. In this case, it is also desirable to be a configuration having a plurality of antennas, but it may also be a configuration having one antenna.

In addition, the present invention is not limited to the above-described embodiments, and it is needless to say that various modifications can be made in a range not departing from the gist of the invention.

INDUSTRIAL APPLICABILITY

According to the producing method of thin film transistor of the present invention, the oxygen deficiency of the oxide semiconductor layer is prevented, the oxide semiconductor layer with excellent film quality can be formed, and the oxide semiconductor layer can be formed at a high film formation speed to improve the productivity.

What is claimed is:
1. A method for producing a thin film transistor having a gate electrode, a gate insulating layer, an oxide semiconductor layer, a source electrode and a drain electrode on a substrate, comprising:

a step of forming the oxide semiconductor layer on the gate insulating layer by performing sputtering on a target with plasma, wherein the step of forming the oxide semiconductor layer comprises:
 a first film formation step of supplying only argon as a sputtering gas to perform sputtering; and
 a second film formation step of supplying a mixed gas of argon and oxygen as the sputtering gas to perform sputtering; and
 a bias voltage applied to the target is a negative voltage of −1 kV or higher, wherein a concentration of the oxygen in the mixed gas in the second film formation step is 5% or less.

2. The method for producing a thin film transistor according to claim 1, wherein a film thickness of a first semiconductor layer formed by the first film formation step is greater than a film thickness of a second semiconductor layer formed by the second film formation step.

3. The method for producing a thin film transistor according to claim 2, wherein the bias voltage is a negative voltage of −600V or higher.

4. The method for producing a thin film transistor according to claim 2, wherein in the step of forming the oxide semiconductor layer, the second film formation step is performed after the first film formation step.

5. The method for producing a thin film transistor according to claim 2, wherein in the step of forming the oxide semiconductor layer, the first film formation step is performed after the second film formation step, and then the second film formation step is further performed.

6. The method for producing a thin film transistor according to claim 2, wherein the first film formation step and the second film formation step are performed at a pressure of 0.5 Pa or higher and 3.1 Pa or lower.

7. The method for producing a thin film transistor according to claim 1, wherein the bias voltage is a negative voltage of −600V or higher.

8. The method for producing a thin film transistor according to claim 7, wherein in the step of forming the oxide semiconductor layer, the second film formation step is performed after the first film formation step.

9. The method for producing a thin film transistor according to claim 7, wherein in the step of forming the oxide semiconductor layer, the first film formation step is performed after the second film formation step, and then the second film formation step is further performed.

10. The method for producing a thin film transistor according to claim 1, wherein in the step of forming the oxide semiconductor layer, the second film formation step is performed after the first film formation step.

11. The method for producing a thin film transistor according to claim 1, wherein in the step of forming the oxide semiconductor layer, the first film formation step is performed after the second film formation step, and then the second film formation step is further performed.

12. The method for producing a thin film transistor according to claim 1, wherein the first film formation step and the second film formation step are performed at a pressure of 0.5 Pa or higher and 3.1 Pa or lower.

13. The method for producing a thin film transistor according to claim 1, wherein the sputtering in the first film formation step and the second film formation step is performed using a sputtering apparatus, the sputtering apparatus comprising: a vacuum container which is evacuated and into which a gas is introduced; a substrate holding part which holds a substrate in the vacuum container; a target holding part which holds the target so as to face the substrate in the vacuum container; and a plurality of antennas arranged along a surface of the substrate held by the substrate holding part and generates the plasma.

* * * * *